United States Patent
Bao et al.

[11] Patent Number: 6,150,668
[45] Date of Patent: Nov. 21, 2000

[54] THIN-FILM TRANSISTOR MONOLITHICALLY INTEGRATED WITH AN ORGANIC LIGHT-EMITTING DIODE

[75] Inventors: Zhenan Bao, North Plainfield; Ananth Dodabalapur, Millington; Howard Edan Katz, Summit; Venkataram Reddy Raju; John A. Rogers, both of New Providence, all of N.J.

[73] Assignee: Lucent Technologies Inc., Murray Hill, N.J.

[21] Appl. No.: 09/391,729

[22] Filed: Sep. 8, 1999

Related U.S. Application Data

[63] Continuation of application No. 09/087,201, May 29, 1998, abandoned.

[51] Int. Cl.[7] .................................................. H01L 33/00
[52] U.S. Cl. ................................ 257/40; 257/59; 257/72; 257/99; 313/504
[58] Field of Search ................................ 257/40, 72, 59, 257/99; 313/503, 504

[56] References Cited

U.S. PATENT DOCUMENTS

| | | | |
|---|---|---|---|
| 5,319,206 | 6/1994 | Lee at al. | 250/370.09 |
| 5,640,067 | 6/1997 | Yamauchi et al. | 313/504 |
| 5,670,792 | 9/1997 | Utsugi et al. | 257/59 |
| 5,970,318 | 10/1999 | Choi et al. | 438/99 |

FOREIGN PATENT DOCUMENTS

WO 99/54936  10/1999  WIPO ............................. H01L 27/00

OTHER PUBLICATIONS

Dodabalapur et al., *Applied Physics Letters*, US American Insustitute of Physics, New York, "Organic Smart Pixels", vol. 73, No. 2, pp. 142–144, Jul. 13, 1998.

Jackson et al., *IEEE Journal of Selected Topics in Quantum Electronics*, "Organic Thin–Film Transistors for Organic Light–Emitting Flat–Panel Display Backplanes", vol. 4, No. 1, pp. 100–104, 1998.

Wu et al., *IEEE Electron Device Letters*, "Integration of Organic LED's and Amorphous Si TFT's ontp Flexible and Lightweight Metal Foil Substrates", vol. 18, No. 12, pp. 609–612, Dec. 12, 1997.

*Primary Examiner*—Jerome Jackson, Jr.
*Assistant Examiner*—Bradley Baumeister
*Attorney, Agent, or Firm*—Richard J. Botos

[57] ABSTRACT

A device in which one or more thin film transistors are monolithically integrated with a light emitting diode is disclosed. The thin film transistor has an organic semiconductor layer. The light emitting layer of the light emitting diode is also an organic material. The device is fabricated economically by integrating the fabrication of the thin film transistor and the light emitting diode on the substrate and by employing low cost fabrication techniques.

10 Claims, 1 Drawing Sheet

THIN-FILM TRANSISTOR MONOLITHICALLY INTEGRATED WITH AN ORGANIC LIGHT-EMITTING DIODE

This is a continuation of application Ser. No. 09/087,201, filed on May 29, 1998 now abandoned.

BACKGROUND OF THE INVENTION

1. Technical Field

The present invention is directed to an organic light-emitting device and a thin film transistor which are monolithically integrated. The present invention is also directed to a process for making the device.

2. Art Background

Light emitting diodes (LEDs) with an organic layer as the active layer have been developed for use in flat panel displays. LEDs with organic thin films are attractive because such devices need not be produced on a crystalline substrate, the cost of producing such devices is low, the devices operate at low voltage, and the organic thin films enable devices that emit light in a variety of colors to be produced. Consequently LEDs are attractive for use in making flat panel displays that are unbreakable, lightweight, flexible, and inexpensive.

Thin-film transistors (TFTs) have been used as the switching elements in liquid crystal displays. As noted in Wu, C., et al., "Integration of Organic LED's and Amorphous Si TFT's onto Flexible and Lightweight Metal Foil Substrates," *IEEE Electron Device Letters*, Vol. 18:12, pp. 609–612 (1997), there is a desire to integrate TFTs and LEDs for making active-matrix emissive flat panel displays. The device 10 described in the Wu et al. article is illustrated in FIG. 1. Both the LED 11 and the TFT 12 are formed on a stainless steel foil substrate 13. The TFT is formed by depositing an insulating layer 14 over the foil substrate 13. A chromium gate 15 is formed on the substrate, over which is formed another insulating layer 16.

A layer of undoped amorphous hydrogenated silicon 17 is formed on the insulating layer, over which is formed a layer of $n^+$ amorphous hydrogenated silicon 18. Chromium source/drain contacts 19 are formed on the doped silicon layer 18. After the TFT is fabricated, the LED 11 is formed by depositing a platinum anode 21 on the source/drain contact 19. A layer of luminescent polymer 22 is formed over the source/drain contact 19 and the platinum anode 21. The cathode (double-layer Mg:Ag(10:1)/ITO) 23 is formed on the surface of the luminescent polymer and placed so that the luminescent polymer is sandwiched between the anode 21 and the cathode 23.

Wu et al. note the advantages for producing an integrated TFT and LED on a plastic substrate. However, Wu et al. farther note that such a device would be difficult to fabricate due to the mechanical and chemical instabilities of such substrates. The integrated device described by Wu et al. essentially requires that the TFT be formed first on the substrate followed by formation of the LED.

The desirability of a TFT driving an LED with an organic layer is also noted in Hatalis, M., et al. "Polysilicon TFT active matrix organic ETL displays," *SPIE* Vol. 3057, pp. 277–286 (1997). Hatalis et al. describes integrating a poly-silicon TFT with an organic LED on a glass substrate. The TFT structure described by Hatalis et al. has a doped polycrystalline silicon source and drain regions formed on the glass substrate. The gate dielectric material is silicon dioxide formed by heating the substrate with the polycrystalline silicon formed thereon to 1000° C. in an oxygen containing atmosphere. The gate is also doped polycrystalline silicon. A layer of silicon dioxide is formed over the TFT device, with contact windows etched through the passivation layer to the source and drain regions and filled with aluminum. The data lines formed on top of the passivation layers is patterned aluminum. Another layer of passivation oxide is formed over the aluminum with vias etched therein for the pixel contacts. A patterned indium tin oxide (ITO) layer is formed over the passivation layer. The active organic material is formed over the ITO, over which a top electrode is formed.

The device described in Hatalis et al. is also difficult to fabricate. Specifically, the fabrication requires high temperature processing and numerous lithographic and etching steps to form the vias.

Accordingly, a monolithically integrated LED and TFT in which the LED and TFT are formed using a simplified process is desired.

SUMMARY OF THE INVENTION

The present invention is directed to a device in which a thin film transistor (TFT) is monolithically integrated with a light emitting diode (LED). The LED has a layer or layers of active material (i.e. the material in which electron or hole transport occurs or in which electron/hole recombination occurs) sandwiched between an anode and a cathode. The cathode is the electrically conductive contact that injects electrons into the active layer(s). The anode is the electrically conductive contact that injects holes into these active layers. In the TFT, electron or hole transport occurs in the semiconductive layer. Thus, the semiconductive layer of the TFT device is also referred to as an active layer. In the present invention, at least one of the active layers of the LED and the semiconductor layer of the TFT are organic materials.

Because layers of these organic materials are relatively easy to form on a substrate, these materials are advantageous from both a device design standpoint and a processing standpoint. Consequently, many different device configurations are possible when these organic materials are used in the integrated device. Furthermore, a variety of different processing techniques can be used to form such devices, allowing for flexibility in choosing processing techniques. The present invention is also directed to processes for making such devices that are both economical and efficient.

If the device configuration is such that light is emitted from the LED through the substrate, the substrate must be transparent. Either glass substrates or transparent plastic substrates are contemplated as suitable. It is advantageous if the substrate is a transparent plastic substrate such as a polyester or polyimide substrate, because such substrates are inexpensive, durable, flexible, and lightweight. If the device configuration is such that the LED does not emit light through the substrate, opaque substrates such as silicon, steel, or opaque plastic substrates are contemplated as suitable.

In the embodiments of the present invention wherein the light emission is through the substrate, the anode of the LED device formed directly on the transparent substrate is also transparent. Examples of suitable transparent anode materials are transparent conducting metal oxides such as indium tin oxide (ITO).

The gate contact of the organic TFT is also formed directly on the transparent substrate. Again suitable materials for the gate contact of a TFT with an active organic layer are well known to one skilled in the art. Examples of suitable materials include vacuum evaporated metals such as gold, aluminum, and platinum. Soluble conducting polymers such as polyaniline, poly(3,4-(ethylene-dioxy)thiophene) and polypyrrole are also contemplated as suitable. Conductive particle-based polymer composites such as silver ink and graphite ink are also contemplated as suitable.

In the device configuration wherein the transparent anode of the LED is formed directly on the transparent substrate, it is advantageous if the gate contact of the organic TFT and the anode of the organic LED are the same material so that both can be formed using one deposition step and one lithographic processing sequence. Consequently, in the embodiments of the present invention wherein the LED anode is a transparent metal oxide, it is advantageous if the gate contact is the same transparent metal oxide.

A layer of insulating material is formed over the gate contact. Insulating materials suitable for use in organic TFT devices are well known and all are contemplated as suitable. Examples of suitable materials are inorganic material such as silicon oxide ($SiO_2$) and silicon nitride ($Si_3N_4$). Soluble polymer dielectrics such as polyimide and poly(methyl methacrylate) are also contemplated as suitable. Other examples of suitable dielectric materials include photodefinable polymer dielectrics such as benzocyclobutene and commercially available spin-on glass materials. From a processing perspective, it is advantageous if the insulating layer is either a soluble polymer dielectric material, a photodefinable dielectric material or a spin-on glass. Such materials are advantageous because layers of these materials are formed on the substrate by low-cost processing techniques such as spin-coating, casting, and printing (e.g. screen printing, ink-jet printing, soft lithography patterning and spraying). Soft lithography is described in Qin, D., et al., "Microfabrication, Microstructures and Microsystems," *Topics in Current Chemistry*, Vol. 194, p. 2–20 (1998), which is hereby incorporated by reference.

The organic TFT device has source and drain contacts. Materials suitable for use as the source and drain contacts for the organic TFT device are well known and all are contemplated as suitable. Examples of suitable materials include the above-described vacuum evaporated metals, soluble conducting polymers, and conductive particle-based polymer composites. Typically the source and drain contacts are formed over the insulating layer or over a layer of organic semiconductor material formed over the insulating layer.

Examples of suitable organic semiconductor materials with suitable field effect mobilities and other desirable semiconductor properties are well known to one skilled in the art. Such materials are either p-type materials or n-type materials. A variety of techniques are employed for depositing a layer of such materials. For example, layers of p-type conjugated oligomers such as thiophene oligomers, oligomers with fused ring moieties, and metallophthalocyanines are formed by vacuum evaporation. Layers of n-type materials such as fluorinated metallophthalocyanines, anhydrides such as perylenetetracarboxylic dianhydride and imide derivatives thereof, $C_{60}$ and tetracyanonaptho-2,6-quinodimethane are contemplated as suitable. Other examples of suitable organic semiconductor materials are soluble conjugated polymers, oligomers, and fused ring molecules. Soluble semiconductor materials are advantageous because layers of these materials are formed using low-cost processing techniques such as screen-printing, ink-jet printing, soft lithography patterning, and spray applications.

Over the anode of the LED is formed an organic hole transporter layer. Organic hole transporter layers are well known to one skilled in the art. The p-type organic semiconductor materials described above are also suitable for use as the hole transporter layer for the LED. It is advantageous if the material for the hole transporter layer is the same as the material for the semiconductor material to limit the number of deposition and patterning steps required to fabricate the device.

An electron transport/light emitter layer is formed over the organic hole transporter layer. In one embodiment of the present invention, the electron transport layer is 8-hydroxyquinolinato aluminum (Alq). A cathode is then formed over the electron transport layer.

The above-described device is advantageous not only because of its performance, but because it can be manufactured economically both from a cost of materials perspective and a cost of processing perspective. In this regard, it is advantageous if a device configuration is selected that permits simultaneous deposition of layers for both devices (e.g. the anode of the LED and the gate of the TFT; the semiconductor layer for the TFT and the hole transporter layer of the LED). In this regard, it is advantageous if, to the extent possible, the same materials are used to form both the LED and the TFT. Finally, it is advantageous if the materials are selected to keep processing as simple and economical as possible. In this regard it is advantageous if both devices are formed using materials that are deposited on the substrate by a printing technique such as screen printing or ink-jet printing.

DETAILED DESCRIPTION

The present invention is directed to a device in which a TFT and an LED are monolithically integrated on a single substrate, and processes for fabricating these devices. The TFT has source, drain, gate and channel regions formed on the substrate. The LED has a layer or layers of active material sandwiched between an anode and a cathode. One skilled in the art will appreciate that the TFT and LED are formed in a variety of configurations. Device configuration, as used herein, is the placement of the portions of the device (e.g. source, drain, etc. of the TFT; active material, anode, and cathode of the LED) relative to each other. In the present invention, materials and processes are described for making a device in which the TFT and LED are monolithically integrated. For convenience, the materials and processes are described in the context of specific device configurations. However, the present invention is not limited to a specific TFT or IED configuration. For example, the source and drain contacts of TFT can be formed either on the insulating material layer or on the semiconductor material layer. A TFT device with either configuration will perform adequately.

Figure 1:
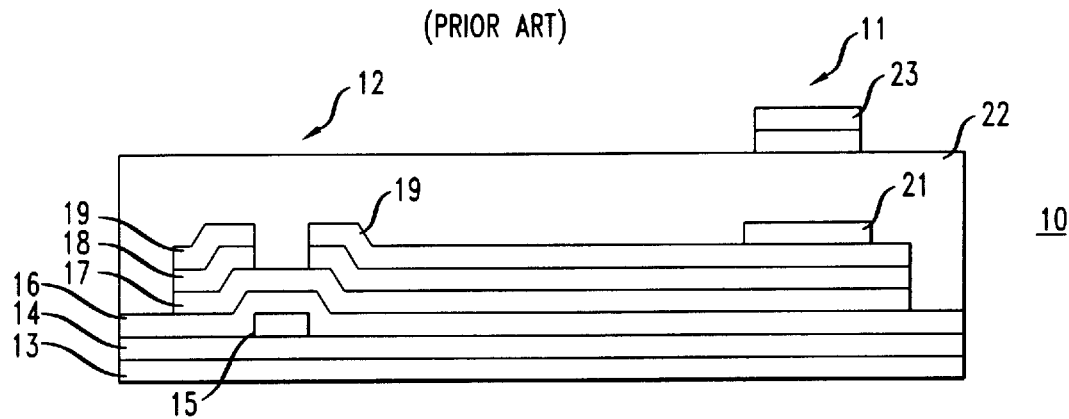
FIG. 1 is a schematic of a prior art LED having an organic thin film that is integrated with a TFT.
Figure 2:
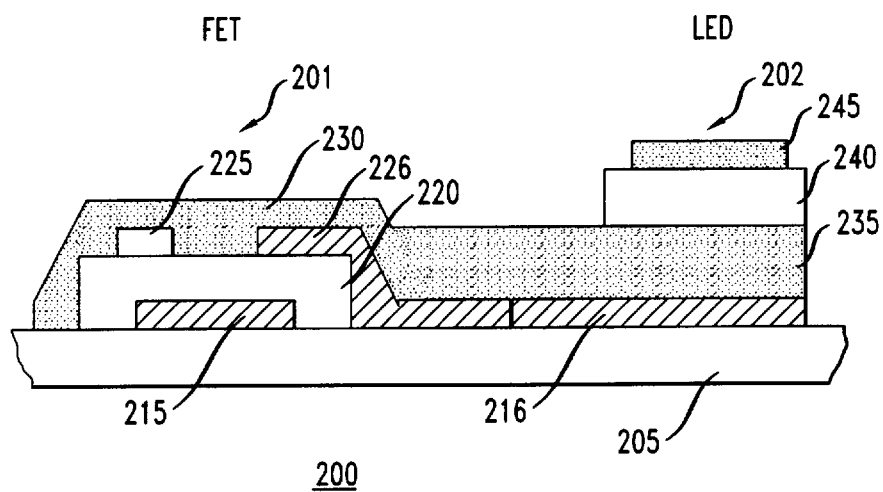
FIG. 2 is a schematic of one embodiment of a monolithically integrated LED and TFT of the present invention, wherein both devices have active layers of an organic material.

Referring to FIG. 2, in one embodiment of the present invention, the monolithically integrated organic TFT and organic LED 200 is formed in the following sequence. A conducting layer is first deposited onto a transparent substrate 205. To simplify processing, it is advantageous for this layer to serve as both the gate 215 of the field effect TFT (FET) 201 and the anode 216 of the LED 202. The layer is made of a material with low resistivity (less than about $10^{-2}$ ohm-cm) to serve as the FET gate 215. The layer also has low resistance, high optical transmittance, and a relatively high work function to serve as the anode 216 of the LED 202. Examples of materials that satisfy these criteria include indium tin oxide (ITO) or zinc oxide (thicknesses greater than about 1000 angstroms).

In those embodiments of the present invention wherein the gate electrode is made of a different material than the LED anode, metals such as gold are also contemplated as suitable for the FET gate 215. Soluble conducting polymers such as polyaniline, poly(3,4-ethylene-dioxythiophene) and polypyrrole are also contemplated as suitable. Conductive particle-based polymer composites such as silver ink and graphite ink are also contemplated as suitable.

Patterning the conducting layer defines the FET gate 215 and the LED anode 216. Patterning is accomplished, for example, by printing or molding material that serves as or is converted to the conducting layer (e.g. micromolding, or printing wetting patterns for, sol gel precursors for conducting glasses). The conducting layer is patterned by printing an etchant or using an etchant with a removable mask to remove selected regions of a uniformly deposited layer. In another embodiment the conducting layer is patterned by printing a resist, or coating the substrate with an energy-definable material which is subsequently patterned so that the patterned material protects certain regions of the layer from an etchant. In another embodiment, patterning is accomplished by printing a wetting pattern or an adhesion promoting/demoting pattern that can be used to define a resist layer. Also, patterning is accomplished by printing a catalyst or initiator for the electroless deposition of metal on a substrate (e.g. palladium catalyst for nickel or copper deposition; gold colloid for gold deposition). Additive processing in which the conductive layer is deposited in the desired pattern is advantageous because it eliminates the need to remove a portion of the layer in order to obtain the desired pattern, therefore making efficient use of conductive material.

For subtractive processing that requires etching and removal of material, there are advantages to using fabrication sequences that use a resist layer that can also serve as the dielectric layer of the TFT device. For example, a thin printed layer of photosensitive polyimide could be used as a resist layer. After the polyimide layer has been used as a resist mask to pattern the underlying conductive layer, the mask remains on the substrate as the dielectric layer 220 of the FET 201.

The dielectric layer 220 for the FET 202 is then formed. This layer provides electrical isolation of the FET gate from the electrodes (capacitance greater than about $10^{-9}$ F/cm$^2$). The dielectric layer 220 is sufficiently thin to allow low (i.e., less than 40 volts) voltage operation of the FET and is chemically compatible with the conductive layer. The dielectric layer 220 is patterned so that it does not cover the anode 216 of the LED 202. In the embodiment where the resist and the dielectric are the same material, forming the patterned dielectric involves selective removal of part of the dielectric to expose the FET gate contact and the LED anode. In other approaches, the dielectric layer is formed on the patterned conducting layer using printing methods. For many printing techniques it is advantageous for the dielectric to be processed as a liquid (e.g. in the form of a prepolymer or a solution, suspension or slurry) that can be solidified after patterning. Many types of thermally or photochemically curable polymers are well-suited for the dielectric layer. Polyimide and poly(methyl methacrylate) are examples of such materials. Other examples of suitable dielectric materials include photodefinable polymer dielectrics and spin-on glass.

Figure 3:
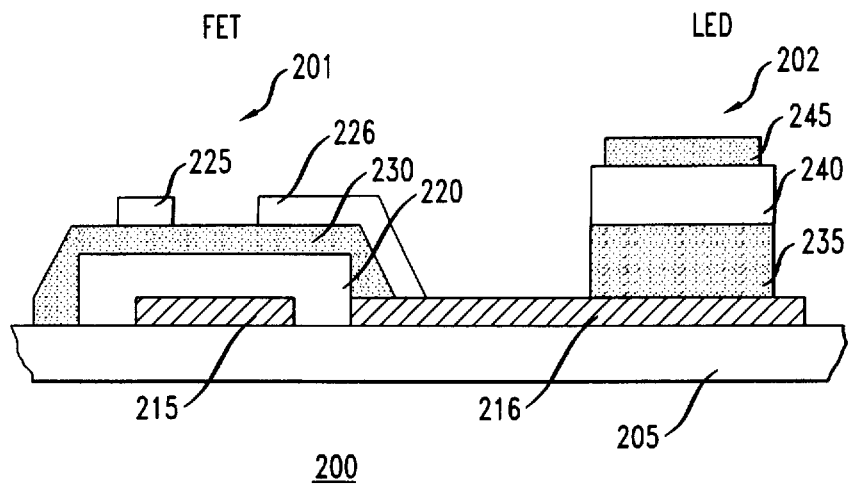
FIG. 3 is a schematic of a second embodiment of a monolithically integrated LED and TFT of the present invention, wherein both devices have active layers of an organic material.

After the conducting and dielectric layers are formed on the substrate, either the source electrode 225 and drain electrode 226 of the FET 201 or (referring to the alternate embodiment in FIG. 3) the semiconducting material 230 of the FET are deposited. FIG. 2 illustrates the embodiment of the present invention wherein the semiconducting material layer of the FET device is formed after the source and drain electrodes of the FET are formed. FIG. 3 illustrates the embodiment of the present invention wherein the semiconducting material layer of the FET device is formed before the source and drain electrodes of the FET are formed. The configuration depicted in FIG. 2 is advantageous because the contacts are easier to pattern and the contact deposition does not affect the semiconductor layer, which is deposited after contact formation. However, the configuration in FIG. 3 is advantageous because the top contact provides a better interface for electrical interconnection and the interface between the semiconductor and top contacts is more easily modified (if required) for improved electrical interconnection.

In the embodiments of the present invention wherein the electrodes are printed onto the substrate, it is advantageous to deposit the semiconducting material first because printed electrodes are often relatively thick and not amenable for use in FETs that employ active material deposited over the electrodes. Materials for the electrodes should be good conductors, chemically compatible with the dielectric (e.g. they should be exist in solvents that do not disturb the dielectric material), and suitable for use with printing methods (e.g. for some printing techniques, they should be solvent processable). The properties of the interface between the electrode and the active material should also allow for acceptable operation of the FET. In some embodiments, the properties of the interface are improved by forming interlayers with certain desirable properties between the electrode and the active material. Examples of electrode materials that satisfy these criteria include conducting carbon deposited from suspension, polyaniline deposited from solution, conducting silver paste, and the materials previously described.

Referring to FIG. 2, once the electrodes 225 and 226 are formed, the semiconductor material 230 is deposited. This material should have properties that yield FETs with the required performance. For most applications, mobilities greater than $10^{-3}$ cm$^2$/Vs and on/off ratios greater than 10 (and a conductivity less than $10^{-5}$ S/cm) are sufficient. Although the semiconductor layer 230 only needs to be present in the narrow region between the source 225 and drain 226 electrodes, it is advantageous to choose a semiconductor material that can also serve as a hole transporter 235 for the LED 202.

Examples of such materials include the following p-type semiconducting materials: oligothiophene (i.e. Di-R-α-nT wherein n is 4 to 8, T is 2,5-thiophenediyl and R is either $C_mH_{2m+1}$ wherein m is 0 to 18 or $C_yH_{2y+1}OC_zH_{2z}$ where z+y=4 to 17, y is greater than zero, and z is greater than 2); pentacene; Di-R-anthradithiophene (wherein R is as previously described); bis-benzodithiophene; and phthalocyanine coordination compounds wherein the coordinate is either a metal such as copper, zinc, tin, or iron, or hydrogen. Suitable anthradithiophene semiconductors are described in Laquindanum, J, et al., "Synthesis, Morphology, and Field-Effect Mobility of Anthradithiophenes," *J. Am. Chem. Soc.*, Vol. 120, pp. 664–672 (1998), which is incorporated by reference herein. Suitable benzodithiophenes are described in Laquindanum, et al., "Benzodithiophene Rings as Semiconductor Building Blocks," *Adv. Mater.* Vol. 9 (1), pp. 36–39 (1997), which is hereby incorporated by reference.

Such materials are deposited using vacuum deposition. Some of the above-described materials such as Di-R-α-nT wherein n is 4 to 8 and R is $C_mH_{2m+1}$ wherein m is 4 to 6 and Di-R-anthradithiophene (wherein R is $C_6H_{13}$) have finite solubility in certain solvents including aromatic solvents such as chlorobenzene and 1,2,4-trichlorobenzene. Therefore these materials can be deposited on a substrate by spin-coating, casting, and printing. FETs with these semiconductor materials, and the fabrication of such devices, are described in Katz, H., et al., "Synthesis, Solubility, and Field-Effect Mobility of Elongated and Oxa-Substituted α, α-Dialkyl Thiophene Oligomers. Extension of 'Polar Intermediate' Synthetic Strategy and Solution Deposition on Transistor Substrates," *Chem. Mater.*, Vol. 10, No. 2, pp. 633–638 (1998), which is hereby incorporated by reference. These compounds can be cast into a film with a lower off conductivity than other liquid phase, high mobility films, thereby providing a film with a higher on/off ratio.

As illustrated in FIG. 2, the semiconducting material in this embodiment is deposited uniformly over both the FET 201 region and the LED 202 region, and patterning is not required. If the semiconducting material 230 needs to be patterned (FIG. 3), it is preferred that the material is printable, and that the material is soluble in a solvent that is compatible with the dielectric and electrode materials. Poly (3-alkylthiophene) wherein the alkyl group contains about 2 to about 10 carbon atoms is a material that satisfies these requirements. Such TFT devices are described in Bao, Z., et al., "Soluble and processable regioregular poly(3-hexylthiophene) for thin film field-effect transistor applications with high mobility,"*Appl. Phys. Lett.*, Vol. 69, No. 26, p. 4108–4110 (1996), which is hereby incorporated by reference. This polymer is advantageous because it provides a continuous film and, consequently, uniformity among devices.

In one embodiment of the present invention, the active semiconducting layer in the FET is an organic polymer that has a carrier mobility greater than about $10^{-3}$ cm$^2$/Vs and a residual conductivity less than about $10^{-5}$ S/cm. These FET devices have an on/off ratio greater than about 25 at 20° C.

Other examples of suitable semiconducting materials include n-type materials such as fluorinated phthalocyanine coordination compounds wherein the coordinates are as previously described, perylenetetracarboxylic dianhydride and imide derivatives thereof, napthalenetetracarboxylic dianhydride and imide derivatives thereof, $C_{60}$, and 11, 11, 12, 12-tetracyanonaptho-2,6-quinodimethane (TCNNQ). These n-type semiconducting materials are formed on the substrate using vacuum evaporation.

To complete the monolithically integrated device 200, the remaining materials required for the LED 202 are deposited. If the semiconductor material 230 for the FET is not used for a hole transporter (FIG. 3), or if it is otherwise not deposited over the LED anode 216, a layer of a hole transporter 235 is formed if it is required to achieve the necessary performance. Suitable hole transporter materials include N,N'-diphenyl-N,N'-bis(3-methylphenyl)-1,1-biphenyl-4,4'-diamine (TPD). An electron transporter/emitter layer (ETL) 240 deposited over the hole transporter 235 followed by deposition of the cathode 245 completes the LED. Materials for the ETL include polyphenylene vinylene, and 8-hydroxyquinolinato aluminum (Alq). Other examples of electron transport materials included 2-(4-biphenylyl)-5-(4-tert-butylphenyl)-1,3,4-oxadiazole (PBD), 2-napthyl-4,5-bis (4-methoxyphenyl)-1,3-oxazole) (NAPOXA), bis-(8-hydroxyquinaldine) aluminum phenoxide, and bis(10-hydroxybenzo-quinolinato(zinc) (ZnBq2). Materials for the cathode should have low work functions for efficient electron injection into the ETL. Examples of suitable cathode materials include aluminum and calcium.

If patterned emission from the LED is required, the cathode can be patterned, for example, by using a shadow mask during deposition by thermal evaporation. From a processing standpoint, it may be advantageous to pattern the ETL instead of the cathode. If the ETL is solution processable, low cost molding approaches can be used to modulate its thickness, and therefore the intensity of its emission. PPV is an example of an ETL that can be manipulated in this way.

In another example of processing efficiencies that can be employed to fabricate a TFT and an LED, the cathode material of the LED can also be used as the source and drain.

The following materials and process sequence for forming a TFT are advantageous because the sequence and materials integrate well with the formation of an LED on an ITO-coated glass substrate. The ITO is both the gate of the TFT and the anode of the LED. It is advantageous if the gate electrode is patterned by printing a layer of resist material such as polyurethane on the ITO in a desired pattern. The unwanted area of the ITO is exposed through the pattern, and removed using a conventional etchant. The patterned resist is then removed. Alternatively, an etchant is printed onto the ITO layer to delineate the desired pattern in the ITO layer.

The dielectric layer of the TFT device is then printed over the gate of the TFT. Examples of printable dielectric materials include polyimide and poly(methyl methacrylate).

The semiconductor layer of the TFT is then formed by printing, casting, spin-coating, or spraying a liquid phase processable conjugated oligomer (e.g. dihexyl-α-6T) or a conjugated polymer (such as regioregular poly (3-hexylthiophene) onto the substrate.

If the smallest dimension of the source and drain contacts (also referred to as electrodes) or the space between them is greater than 25 μm, the source and drain electrodes are printed using a conducting particle base composite material (such as silver ink or graphite ink) dispensed from an inkjet printer (if the minimum feature size is greater than 75 μm, screen printing can be used). Alternately, a soluble conducting polymer such as polyaniline is printed on the substrate. If the minimum feature size is greater than 1 μm, a conducting particle deposit or conducting polymer is micromolded in capillaries onto the substrate. One of either the source and drain contacts are patterned to contact the anode of the LED.

Once the TFT is formed over the ITO, the active layer or layers of the LED are formed on the substrate. If vacuum deposition is acceptable, a hole transporter layer (e.g. N,N'-diphenyl-N,N'-bis(3-methylphenyl)-1,1-biphenyl-4,4'-diamine (TPD)) is vacuum deposited over the anode. An emitter/electron transport layer (e.g. aluminum tris(8-hydroxyquinoline)(Alq)) is then vacuum deposited over the hole transporter layer. Examples of other active materials that can be vacuum deposited are described in Dodabalapur, A., "Organic Light Emitting Diode," *Solid State*

*Communication,* Vol. 102, pp. 259–267 (1997), which is hereby incorporated by reference.

If it is preferred to deposit the active layers of the LED from solution, a hole transporter layer (e.g. poly(phenylene vinylene (PPV)) is formed on the substrate. The PPV is formed on the anode before the dielectric layer of the TFT is formed thereon. The PPV layer is formed from a PPV precursor that is deposited on the substrate using a doctor's blade and thermally converted to PPV by heating the substrate to about 260° C. under vacuum. An electron transport/emitting layer is formed by printing, casting, or spin-coating poly(cyanoterephthalylidene (CN-PPV) on the substrate after the drain and source electrodes are formed thereon.

In yet another embodiment, a single LED active layer is formed by either printing, casting, or spin coating a solution containing poly(2-methoxy-5-2'-ethyl-hexoxy)-1,4-phenylene vinylene Examples of other active materials that can be deposited in a like manner, and conditions suitable for such deposition are described in Kraft, A., et al. "Electroluminescent Conjugated Polymers-Seeing Polymers in a New Light," *Angew. Chem. Int. Ed.,* Vol. 37, pp. 402–428 (1998), which is hereby incorporated by reference.

In certain embodiments of the present invention, more than one TFT is monolithically integrated with one or more LEDs. In certain instances, when more than one TFT is integrated with a single LED, the power dissipation at the LED is greatly reduced. When the device of the present invention is incorporated into displays and/or systems, it is contemplated that one or more TFTs will drive one or more LEDs. Displays will have multiple rows and multiple columns of the monolithically integrated device of the present invention. Systems with the device of the present invention will also include appropriate drive circuitry.

What is claimed is:

1. A device comprising a light emitting diode monolithically integrated with at least one thin film transistor wherein the light emitting diode comprises an anode, a cathode and at least one active layer comprising a light-emitting material sandwiched between the anode and the cathode and the thin film transistor comprises a gate and a semiconductor material interposed between source and drain contacts such that a current that flows from the source to the drain flows through the semiconductor material from the source to the drain, wherein the thin film transistor and the light emitting diode are formed on a single, unitary substrate, wherein the semiconductor material of the thin film transistor and at least one active layer of the light emitting diode is an organic material and one of either the anode or the cathode of the light emitting diode and the gate of the thin film transistor are the same material and are formed on a common surface.

2. The device of claim 1 wherein the active layer further comprises a layer of a charge carrying material.

3. The device of claim 2 wherein the semiconductor material of the thin film transistor and the charge carrying material of the light emitting diode are the same material.

4. The device of claim 3 wherein the charge carrying material is a hole transporter material.

5. The device of claim 4 wherein the charge carrying material and the semiconductor material are selected from the group consisting of oligothiophene, pentacene, Di-R-anthradithiophene wherein R is either $C_mH_{2m+1}$ wherein m is 0 to 18 or $C_yH_{2y+1}OC_zH_{2z}$ where z+y=4 to 17, y is greater than zero, and z is greater than 2, bis-benzodithiophene, phthalocyanine coordination compounds, and regioregular poly(3-alkylthiophene).

6. The device of claim 3 wherein at least one of the source and drain contacts is electrically connected to the anode.

7. The device of claim 6 wherein the substrate is a transparent substrate and the gate of the thin film transistor and the anode of the light emitting diode are indium tin oxide.

8. The device of claim 7 wherein the transparent substrate material is selected from the group consisting of glass, polyester, and polyimide.

9. The device of claim 8 wherein a plurality of thin film transistors is monolithically integrated with the light emitting diode.

10. The device of claim 1 wherein the anode of the light emitting diode and the gate of the thin film transistor are the same material and are formed on the substrate surface.

* * * * *